US008081573B2

(12) United States Patent
Shackleton et al.

(10) Patent No.: US 8,081,573 B2
(45) Date of Patent: Dec. 20, 2011

(54) AUTOMATIC SEQUENCING BASED ON WIRELESS CONNECTIVITY

(75) Inventors: John J. Shackleton, Minneapolis, MN (US); Yunjung Yi, St. Louis, MO (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/944,863

(22) Filed: Nov. 12, 2010

(65) Prior Publication Data

US 2011/0060828 A1 Mar. 10, 2011

Related U.S. Application Data

(62) Division of application No. 11/961,508, filed on Dec. 20, 2007, now Pat. No. 7,864,775.

(51) Int. Cl.
*G01R 31/08* (2006.01)

(52) U.S. Cl. ......................... 370/238; 370/312; 370/390

(58) Field of Classification Search ........................ None
See application file for complete search history.

(56) References Cited

U.S. PATENT DOCUMENTS

| | | | | |
|---|---|---|---|---|
| 5,173,689 | A | 12/1992 | Kusano | |
| 6,199,010 | B1 * | 3/2001 | Richton | 701/206 |
| 6,741,565 | B1 | 5/2004 | Wicklund | |
| 6,804,244 | B1 | 10/2004 | Anandakumar | |
| 6,892,131 | B2 | 5/2005 | Coffee et al. | |
| 7,006,453 | B1 | 2/2006 | Ahmed | |
| 7,190,672 | B1 | 3/2007 | Whitehall | |
| 7,796,503 | B2 | 9/2010 | Hamada | |
| 7,864,775 | B2 * | 1/2011 | Shackleton et al. | 370/395.3 |
| 2001/0052072 | A1 | 12/2001 | Jung | |
| 2002/0067693 | A1 | 6/2002 | Kodialam et al. | |
| 2002/0145978 | A1 * | 10/2002 | Batsell et al. | 370/238 |
| 2002/0150050 | A1 | 10/2002 | Nathanson | |
| 2002/0191584 | A1 | 12/2002 | Korus et al. | |
| 2003/0083060 | A1 | 5/2003 | Menendez | |
| 2003/0118044 | A1 | 6/2003 | Blanc et al. | |
| 2003/0128706 | A1 | 7/2003 | Mark et al. | |
| 2003/0174652 | A1 | 9/2003 | Ebata | |
| 2004/0174824 | A1 | 9/2004 | Ohta et al. | |

(Continued)

FOREIGN PATENT DOCUMENTS

EP 1134940 9/2001

(Continued)

OTHER PUBLICATIONS

Jacquet et al., "Optimized Link State Routing Protocol for AD HOC Networks ", "Multi Topic Conference, 2001. IEEE INMIC 2001. Technology for the 21st Century Proceedings. ", Dec. 28-30, 2001, pp. 62-68, Publisher: IEEE International, Published in: Piscataway, NJ, USA.

Marina et al., "AD HOC On-Demand Multipath Distance Vector Routing", "Mobile Computing and Communications Review", Jul. 2002, pp. 92-93, vol. 6, No. 3, Publisher: ACM.

(Continued)

*Primary Examiner* — Robert Wilson
(74) *Attorney, Agent, or Firm* — Fogg & Powers LLC

(57) ABSTRACT

A method of determining the sequence of traversing nodes in a communication network is provided. The method comprises with each node, determining other nodes in the network it can reach in a single hop. Creating a local sequence connection order based on the determined other nodes the node can reach in a single communication hop. Storing historical data of local sequence connection order information and determining a new local sequence connection order based in part on the historical data and communication information.

13 Claims, 10 Drawing Sheets

U.S. PATENT DOCUMENTS

| | | | | |
|---|---|---|---|---|
| 2004/0258064 | A1 | 12/2004 | Nakamura | |
| 2004/0260829 | A1 | 12/2004 | Husak | |
| 2005/0054346 | A1 | 3/2005 | Windham et al. | |
| 2005/0073958 | A1 | 4/2005 | Atlas et al. | |
| 2005/0105469 | A1 | 5/2005 | Hao | |
| 2005/0163145 | A1 | 7/2005 | Dombkowski | |
| 2005/0174936 | A1 | 8/2005 | Betker | |
| 2005/0190767 | A1 | 9/2005 | Lee et al. | |
| 2005/0265256 | A1 | 12/2005 | Delaney | |
| 2006/0002337 | A1 | 1/2006 | Itoh et al. | |
| 2006/0023677 | A1 | 2/2006 | Labrador et al. | |
| 2006/0056353 | A1 | 3/2006 | McBride | |
| 2006/0098608 | A1 | 5/2006 | Joshi | |
| 2006/0109831 | A1 | 5/2006 | Tillotson | |
| 2006/0250999 | A1 | 11/2006 | Zeng et al. | |
| 2007/0037568 | A1 | 2/2007 | Warner et al. | |
| 2007/0043656 | A1* | 2/2007 | Lancaster | 705/38 |
| 2007/0054697 | A1 | 3/2007 | Money et al. | |
| 2007/0070983 | A1 | 3/2007 | Redi et al. | |
| 2007/0076633 | A1 | 4/2007 | Sin | |
| 2007/0121521 | A1 | 5/2007 | D'Amico et al. | |
| 2007/0140114 | A1 | 6/2007 | Mosko | |
| 2007/0153817 | A1 | 7/2007 | Osann | |
| 2007/0286097 | A1 | 12/2007 | Davies | |
| 2008/0151793 | A1 | 6/2008 | Wright | |
| 2008/0151841 | A1 | 6/2008 | Yi et al. | |
| 2008/0151889 | A1 | 6/2008 | Yi et al. | |
| 2008/0247335 | A1 | 10/2008 | Rudnick | |
| 2009/0160679 | A1* | 6/2009 | Shackleton et al. | 340/988 |
| 2009/0190514 | A1* | 7/2009 | Yi et al. | 370/312 |
| 2010/0020740 | A1 | 1/2010 | Watanabe | |
| 2011/0060828 | A1* | 3/2011 | Shackleton et al. | 709/224 |

FOREIGN PATENT DOCUMENTS

| | | |
|---|---|---|
| WO | 2006072850 | 7/2006 |

OTHER PUBLICATIONS

"Networking on the Move", "Military & Aerospace Electronics, www.milaero.com", Jun. 2005, pp. 32 Publisher: Penn Well Publishing Co.

Nguyen et al., "Maintaining Communication Link for Tacitcal Ground Robots", "AUVSI Unmanned Systems North America 2005", Aug. 2004, pp. 113, Publisher: AUVSI.

Studer et al., "Efficient Mechanisms to Provide Convoy Member and Vehicle Sequence Authentication in VANETs", "Proceedings of the International Conference on Security and Privacy in Communication Networks", 2007, pp. 111, Publisher: Securecomm.

Zhang et al., "Dynamic Proxy Tree-Based Data Dissemination Schemes for Wireless Sensor Networks", "2004 IEEE International Conference on Mobile AD-HOC and Sensor Systems ", Oct. 2004, pp. 21-30, Publisher: IEEE.

Baccelli et al., "OSPF MPR Extension for AD HOC Networks", Feb. 1, 2007, pp. 1-30, Publisher: IETF Standard Working Draft.

Clausen et al., "Optimized Link State Routing Protocol (OLSR)", Oct. 1, 2003, pp. 1-76, Publisher: IETF Standard, Internet Engineering Task Force.

Clausen et al., "The Optimized Link State Routing Protocol Version 2", Jul. 9, 2007, pp. 1-80, Publisher: IETF Standard-Working-Draft.

Basagni et al., "A Distance Routing Effect Algorithm for Mobility (Dream)", "Proceedings of the 4th Annual ACM/IEEE International Conference on Mobile Computing and Networking", Oct. 1998, pp. 76-84, Publisher: MOBICOM, Published in: New York US.

Camara et al., "A Novel Routing Algorithm for AD HOC Networks", "Proceedings of the Annual Hawaii International Conference on System Sciences", 2000, pp. 18, vol. 2, Published in: Hawaii US.

Jain et al., "Geographical Routing Using Partial Information for Wireless AD HOC Networks", "IEEE Personal Communications", Feb. 2001, pp. 48-57, vol. 8, No. 1, Publisher: IEEE Communications Society, Published in: US.

Lin X et al., "Location-Based Localized Alternate, Disjoint and Multi-Path Routing Algorithms for Wireless Networks", "Journal of Parallel and Distributed Computing", Jan. 2003, pp. 22-32, vol. 63, No. 1, Publisher: Elsevier, Published in: Amsterdam NL.

Little, T. et al., "An Information Propagation Scheme for VANETs", "Intelligent Transporation Systems", Sep. 13, 2005, pp. 155-160, Publisher: IEEE.

Tardec, "National Automotive Center Betronics Intelligent Systems Conference Paper IVSS-2005-MAS-01", "Intelligent Vehicle Systems Edition 2005", Jun. 2005, pp. 240 Publisher: U.S. Army Tank Automotive Research, Development and Engineering Center, Published in: US.

Wischhof, L. et al., "Congestion Control in Vehicular ad hoc Networks", "Vehicular Electronics and Safety", Oct. 14, 2005, pp. 58-63, Publisher: IEEE International Confereone on XI'AN.

* cited by examiner

AUTOMATIC SEQUENCING BASED ON WIRELESS CONNECTIVITY

RELATED APPLICATION

The present application is a divisional application of U.S. application Ser. No. 11/961,508, filed on Dec. 20, 2007, the disclosure of which is incorporated herein by reference.

BACKGROUND

For the purposes of logistics and communication, vehicle convoys often require that each vehicle know its specific order in the overall sequence. Traditionally, the order is assigned statically before the convoy embarks with the assumption that the assigned order will not change in transit. In practice however, the actual order of the vehicles may change in transit. Therefore, a better approach is to endow the convoy with the capability to configure its order dynamically so its order is automatically updated when the order of the convoy changes. A wireless ad-hoc network is a medium over which a dynamic auto-sequencing system could take place. However, there are several limitation to this type of scheme. First of all, any sequencing algorithms used by the system would have to be robust enough to handle frequent lost connections over the wireless connection. Secondly, radio strength can not be relied on as being proportional to geographical proximity due to obstacles, battery power, interference, etc. Thirdly the distance between vehicles does not always reflect the actual sequence of the vehicles (e.g. when going around corners).

For the reasons stated above and for other reasons stated below which will become apparent to those skilled in the art upon reading and understanding the present specification, there is a need in the art for an automatic sequencing that is effective and efficient that over comes the above discussed limitations.

SUMMARY

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a method of determining the sequence of traversing nodes in a communication network is provided. The method comprises with each node, determining other nodes in the network it can reach in a single hop. Creating a local sequence connection order based on the determined other nodes the node can reach in a single communication hop. Storing historical data of local sequence connection order information and determining a new local sequence connection order based in part on the historical data and communication information.

BRIEF DESCRIPTION OF THE DRAWINGS

The present invention can be more easily understood and further advantages and uses thereof more readily apparent, when considered in view of the detailed description and the following figures in which.

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention provide automatic sequencing systems that do not rely on predetermined route information or navigational equipment to determine vehicle order. In embodiments, the order of the vehicles in the convoy is established via the propagation of adjacent node lists throughout the wireless network and a set of heuristic algorithms that utilize snapshots of previous states of the network's connectivity (i.e., historical data). The state of the network is updated constantly and the sequence order of the vehicles is recalculated in such a way that does not put undue burden on the network bandwidth or the processing resources at each wireless node. Each node determines its position in the sequence based on partial information communicated to its adjacent nodes. Therefore, each node is a member of a scalable peer-to-peer network and does not rely on server-client (or master-slave) network architectures to compute the sequence order. Since the network is peer-to-peer, vehicles may be added or subtracted from the convoy in transit.

Figure 1A:
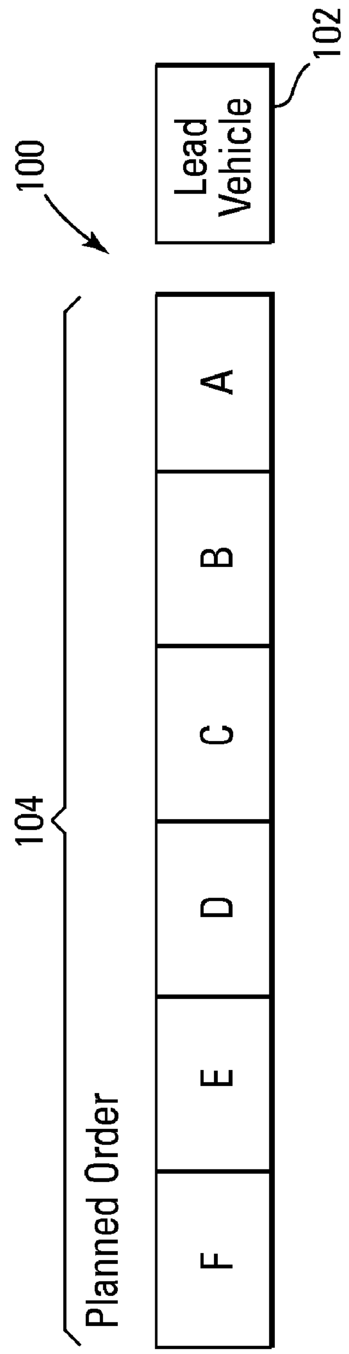
Fig. 1A Prior Art
FIG. 1A is an illustration of a panned order of a vehicle convoy of the prior art.
Figure 1B:
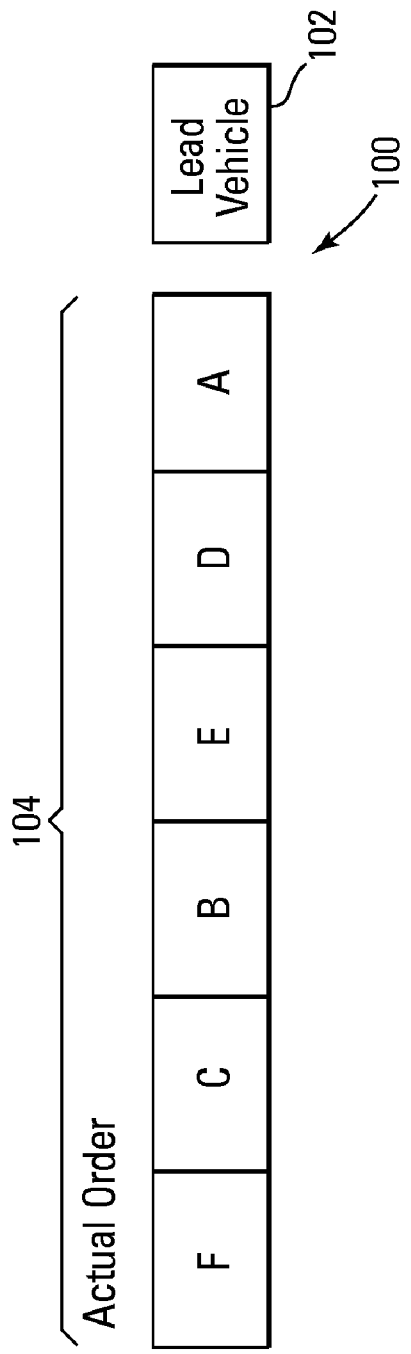
Fig. 1B Prior Art
FIG. 1B is an illustration of the actual order of a vehicle convoy of the prior art.

To provide a foundation for the present invention further background is provided in regards to FIG. 1A which illustrates the planned order of a convoy of vehicles 100. In a vehicle convoy 100 it is often necessary to assign sequence numbers to the vehicle based on their physical position. As illustrated, the convey includes a lead vehicle 102 and following vehicles 104. In the planed order the following vehicles 104 are positioned in a sequential order. The planed order is illustrated in this example as an alphabetic order, A, B, C, D, E and F of FIG. 1A. In practice, however, it is difficult to keep the sequential order of the following vehicles 104 as the vehicles traverse through a route. For example, it is common for the sequence to get mixed up at the start or around a curve while in transit. An example of the actual order of following vehicles 104 during transit is illustrated in prior art FIG. 1B. Hence, assigning the order sequence at the start of the transit is ineffective. If the vehicles in the convoy are part of the same wireless network, the network connectivity can be used to establish the vehicle sequence numbers. There are numerous advantages using network conductivity. For example, using network conductivity does not rely on a predetermined vehicle order. It supports in transit vehicle re-sequencing and the number of vehicles may change in transit. Moreover, it does not rely on navigation technology such as GPS or accelerometers.

Figure 1C:
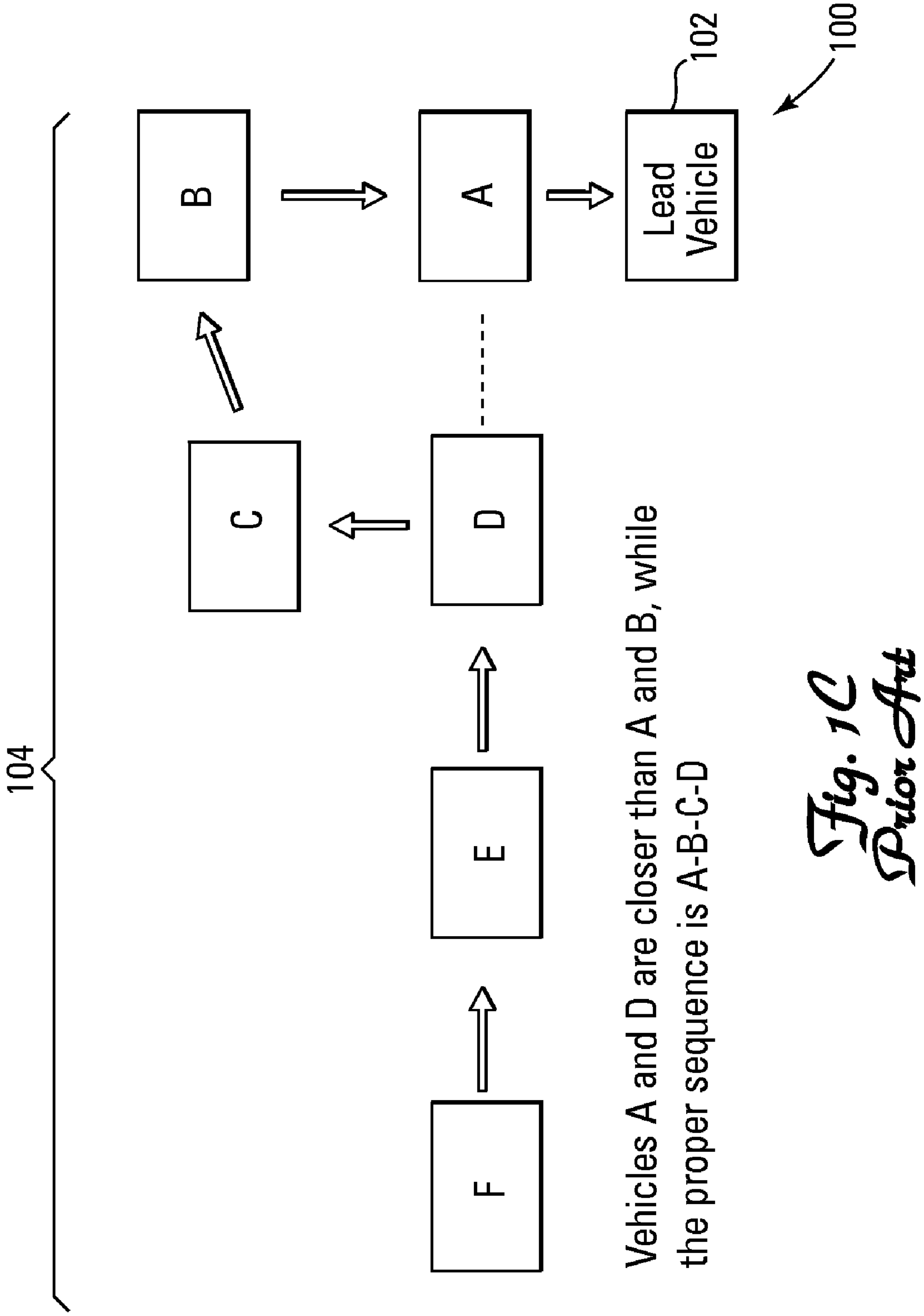
Fig. 1C Prior Art
FIG. 1C is an illustration of a vehicles in a convoy at a particular time of the prior art.

In using network conductivity to determine the sequence order of the following vehicles 104 require the resolution of several technical issues. For example, one way to determine neighbor discovery would be by signal strength. However, radio strength is not always proportional to geographically proximity due to such things as obstacles, battery power and interferences. Moreover, the distance between vehicles cannot be relied on to determine actual sequence. For example, referring to prior art FIG. 1C, when the convoy of vehicles 100 takes a turn vehicles A and D of the following vehicles 104 are closer than vehicles A and B, while the proper sequence is A, B, C and D.

Figure 2:
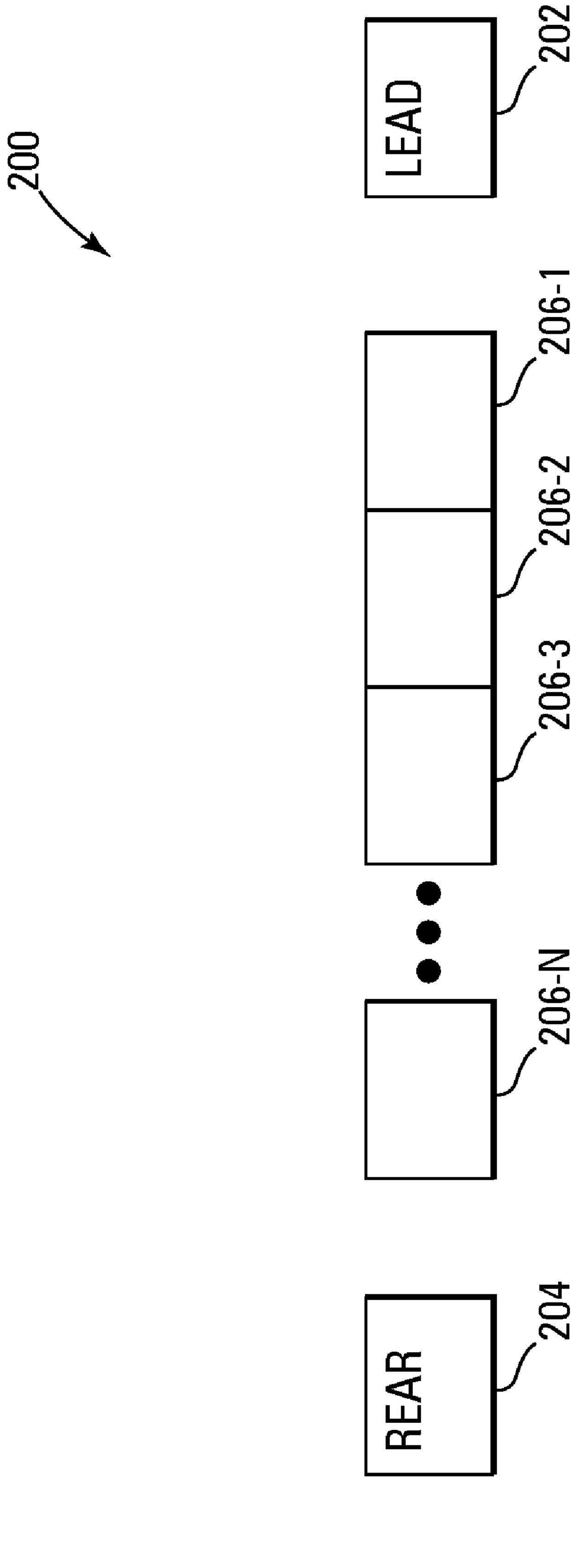
FIG. 2 is an illustration of a vehicle convoy of one embodiment of the present invention.
Figure 3:
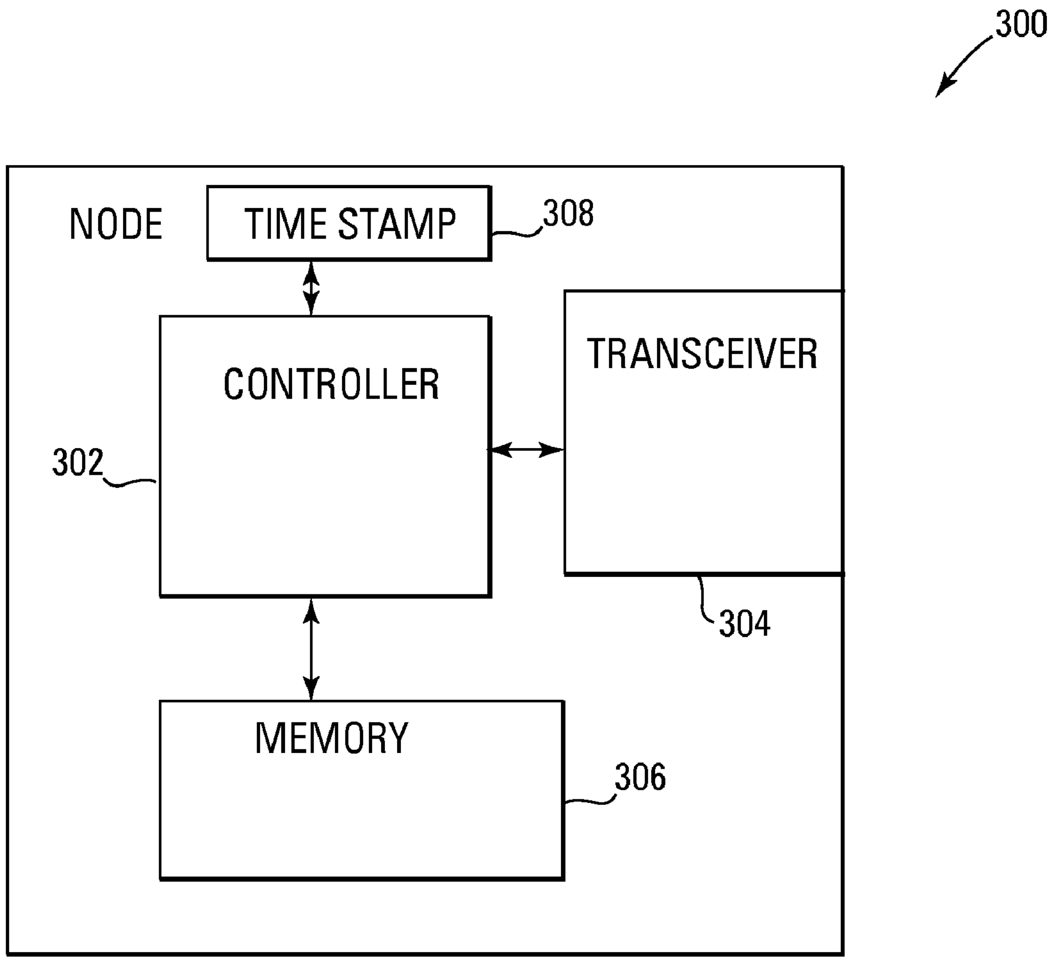
FIG. 3 is a block diagram of a node of one embodiment of the present invention.

Referring to FIG. 2, one embodiment of a vehicle convoy (or network) 200 of the present invention is illustrated. As illustrated, the vehicle convoy 200 includes a lead vehicle 202, an end vehicle 204 and intermediate vehicles 206 (1-N). Each vehicle (or node) 202, 204 and 206 (1-N) only knows about its own view of the network. Thus a node will try to connect to one or more reachable nodes to create a sequence. After a node is initialized, it will determine the other nodes in the network 200 can reach in a single hop. These adjacent nodes will be used to create a local sequence. Each nodes previous state information is stored locally to help arbitrate when the convoy order changes. Historical data at each node is used to calculate probabilities that a change in connectivity equals a change in order. The convoy network 200 assumes that the established order is maintained until the connectivity has been altered a long enough period of time that a new sequence order is required. An example of a node 300 of one embodiment is illustrated in the block diagram of FIG. 3. As illustrated, the node 300 includes a controller 302, a transceiver 304, a memory 306 and a time stamp 308. The transceiver 304 sends and receives signals under control of the controller 302. The memory is used to store historical data of past connections. The controller 302 applies algorithms to received data and stored data to determine the convoy sequence. The time stamp 308 is used by the controller 302 to associate specific times with communication information. For example, a time stamp is used when a refused connection signal is received or when a node was entered in a pending list which is described below.

To establish a connection, a node, such as node 300, sends out a request to an available node. In one embodiment, there are two types of requests, a connect request and a must-connect request. The connect request may be accepted by another node, thereby creating a sequence (or link) between the sender and receiver. A connect request may also be refused. A refusal of a connect request can occur for example when the receiving node already has a connection with two other nodes. A must-connect request must be accepted by the receiving node. A must-connect request is used if a node will be an orphan if it is not connected (i.e. it has no other communication connection available). After accepting a request, the receiving node sends a return accept message to the requester. After refusing a request, the receiving node sends a return refuse message to the requester. Requesting nodes keep a list of pending requests, to track which nodes have been issued connection requests but have not replied with an accept or refuse return message. Each node also tracks which nodes have sent them refuse return messages (with timestamps), so that they avoid re-sending a future request to the refusing node.

The controller 302 of the node 300 in embodiments periodically runs a monitor operation to determine the state of the local sequence connections of the node. The monitor operation determines if the connections in the established local sequence are still valid. In one embodiment, this is done by checking if the nodes in a local sequence or a pending list are still adjacent (in one hop). If a local sequence is not complete, than up to two connection requests may be sent by the node, depending on the node type and the state of the network. The lead 202 or rear 204 nodes may request a connection to at most one node for its local sequence. Intermediate nodes 206 (1-N) may request at most two nodes for a sequence connection. In one embodiment, if an intermediate node is an orphan (i.e., has only one adjacent node), then its connection requests are must-connect types. In one embodiment, any node may have more than two connections if its local sequence includes connections to orphaned nodes. During the monitor operation, a node may decide not to send any connection requests when its local sequence is not complete. For example, if a local sequence is broken because a radio transmission temporarily lost RF contact, then the node can decide to wait so that the failed connection can be re-established in a reasonable amount of time, before requesting connections with new nodes.

Most of the time (in a typical network), the controller 302 of a node 300 will have to select between multiple nodes which is the better node to establish a sequence connection. In these cases, the node will apply an evaluation process to determine the "best" node. The evaluation process assigns a fitness value to each available node. The highest fitness value is determined the "best" candidate node for a sequence connection. Criteria for the fitness value function in one embodiment includes the list of refuse message received by the node, a history of radio signal strength (including time stamps) for each adjacent node, a history of established sequence connections (including timestamps and request type connect or must-connect) for each adjacent node. In one embodiment, a second periodic process is required. The second periodic process is used to remove connection requests in the pending list that have not received timely replies and to remove messages from the refuse list which may be ready to accept new requests.

Figure 4:
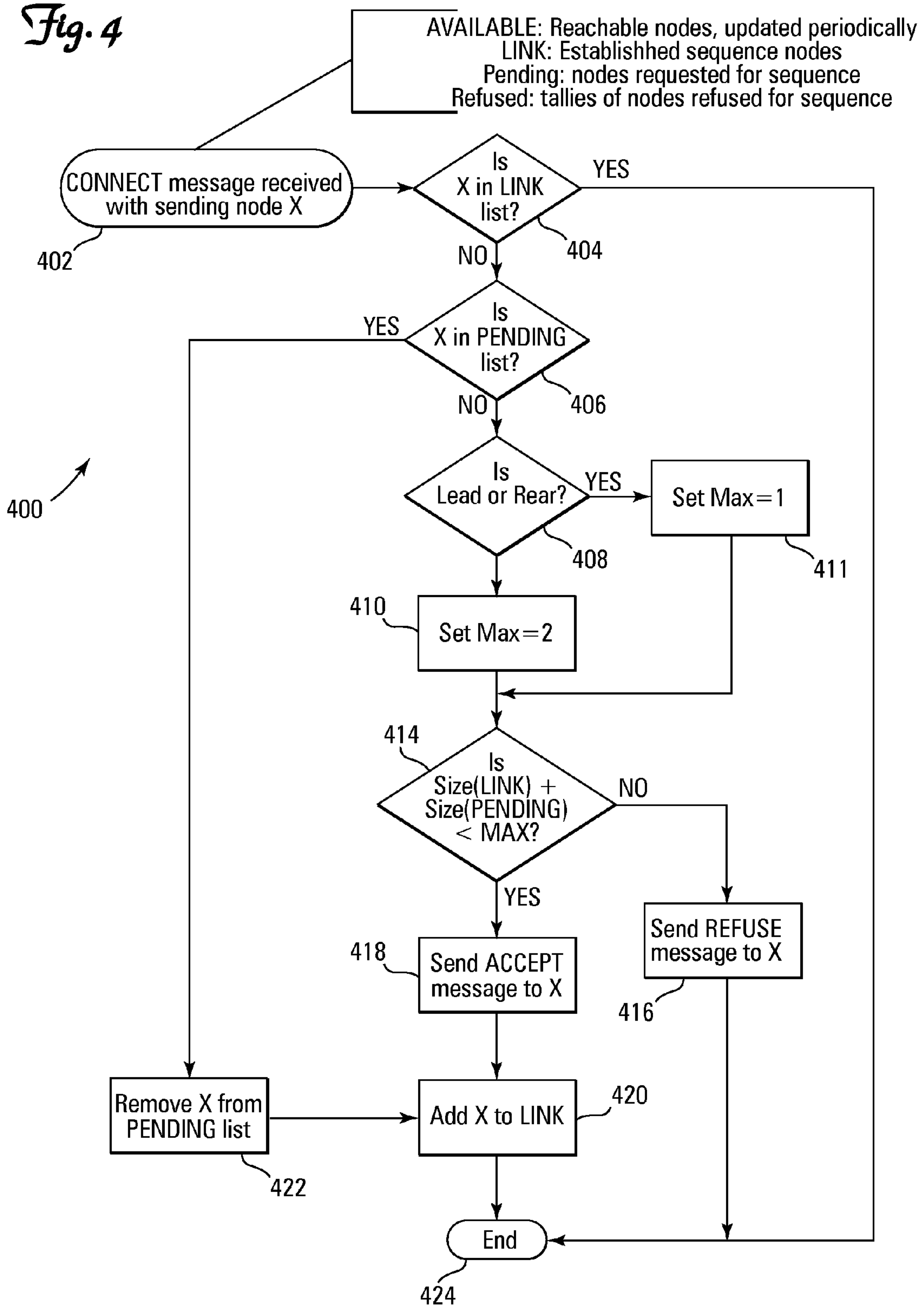
FIG. 4 is an illustration of a reaction flow diagram of one embodiment of the present invention.

Referring to FIG. 4 a reaction flow diagram 400 of one embodiment is illustrated. As illustrated, a connect message is received from sending node X (402). It is first determined if node X is in link list (404). If node X is within link list (402), the process ends (424). If node X is not within the link list (402), it is determined if node X is in a pending list (406). If node X is in a pending list (406), it is then removed from the pending list (422). Then node X is linked (420) and the process ends (424). If node X is not on the pending list (406), it is determined if the node is a lead or rear node (408). If it is a lead or rear node (408), its maximum number of allowable node connections is set to 1 (411). If the node is not a lead or rear node (408), its maximum number of allowable node connections is set to 2 (410). It is then determined if the size of link plus the size of the pending is less than the maximum number of allowable node connections (414). If it is not less than the maximum (414), a refuse message is sent to node X (416) and the process ends (424). If it is less than the maximum (414), an accept message is sent to node X (418). Node X is then linked (420) and the process then ends (424).

Figure 5:
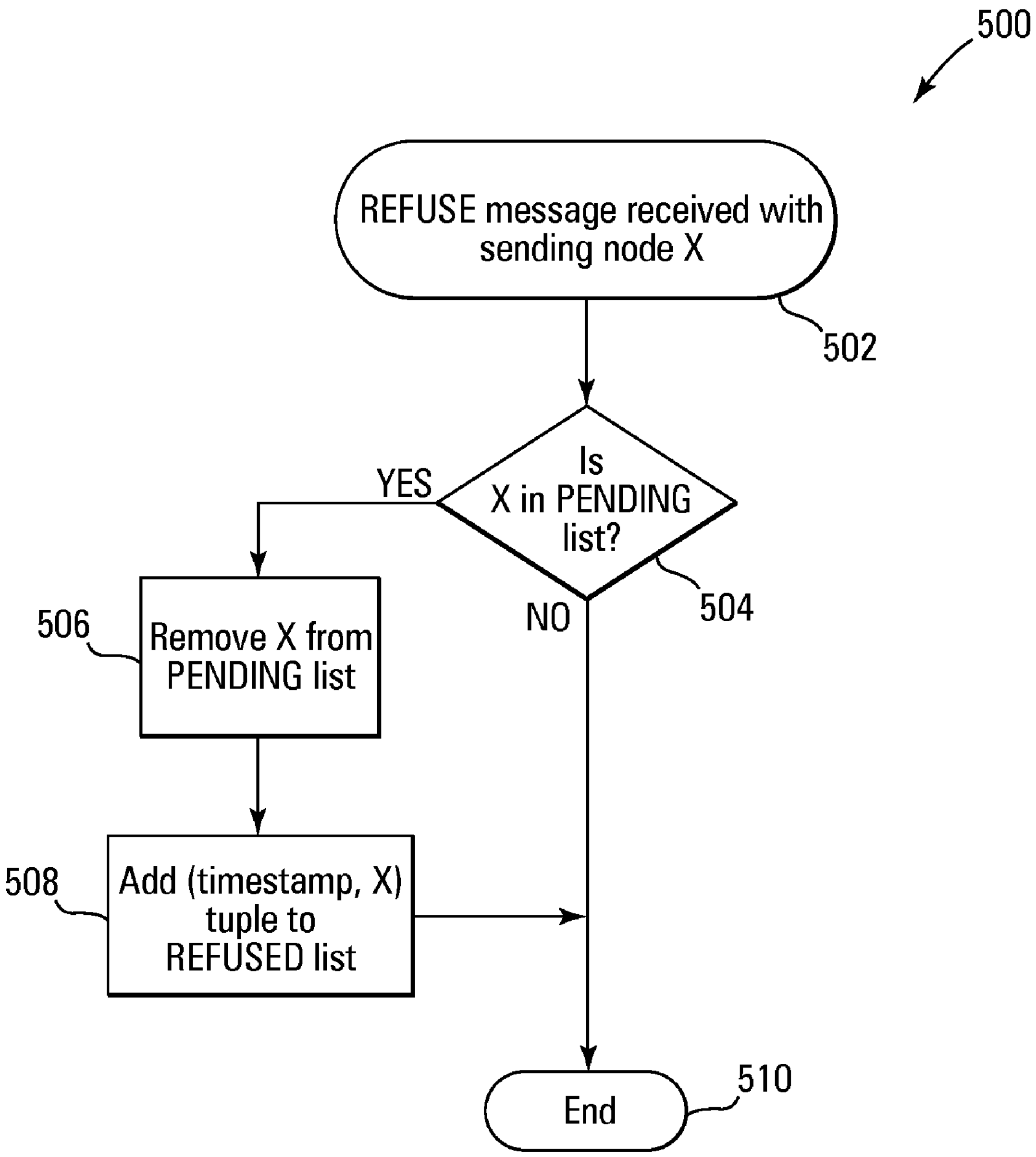
FIG. 5 is an illustration of a refuse receipt request flow diagram of one embodiment of the present invention.
Figure 6:
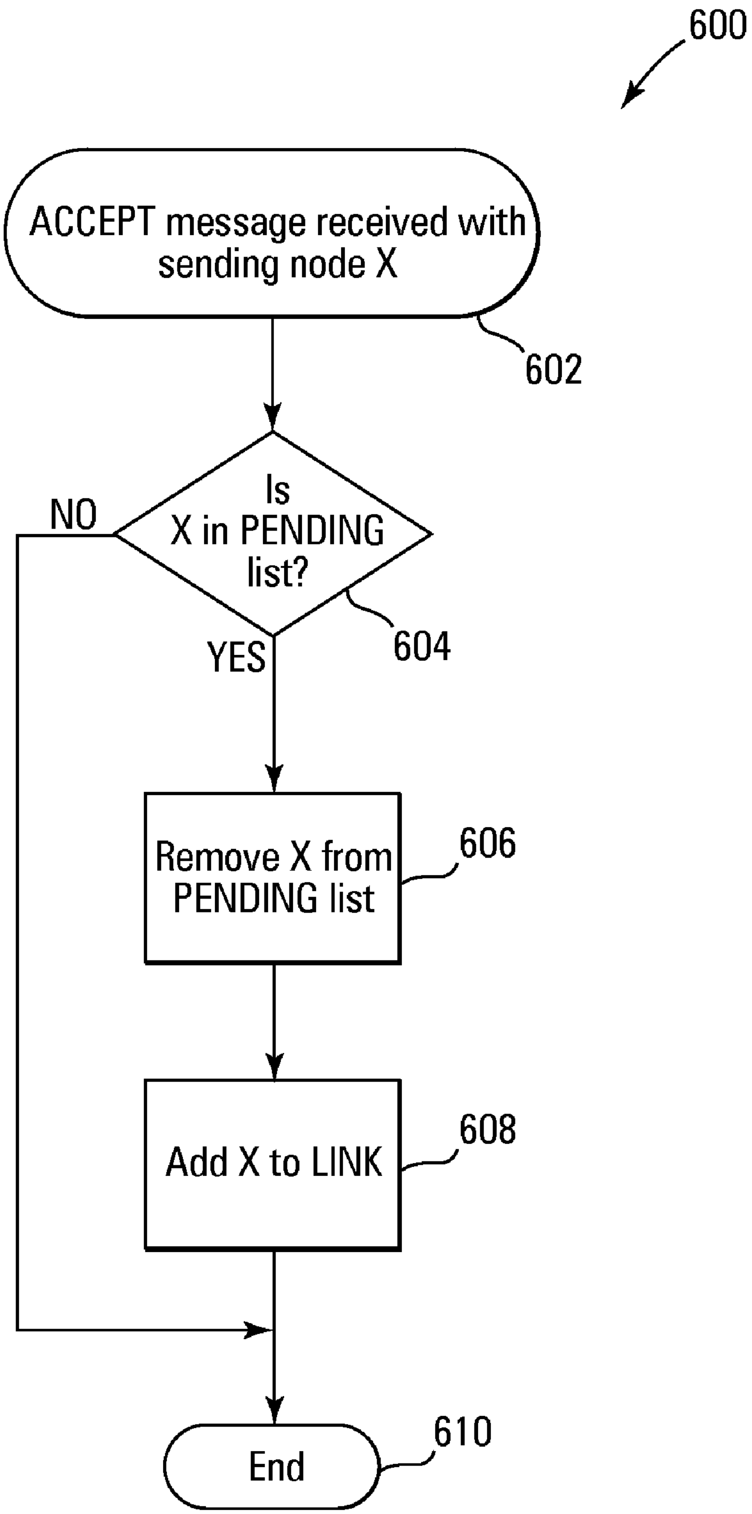
FIG. 6 is an illustration of an accept received flow diagram of one embodiment of the present invention.

FIG. 5 illustrates a refuse receipt request flow diagram 500 of one embodiment. As illustrated, a refuse message is received from sending node X (502). It is then determined if node X is in the pending list (504). If node X is not on the pending list 504, the process ends at (510). If node X is in the pending list (504), it is removed from the pending list (506) and added to the refused list with a time stamp (508). FIG. 6 illustrates an accept received flow diagram 600 of one embodiment. As illustrated, an accept message is received from sending node X (602). It is then determined if node X is currently on the pending list (604). If node X is not on the pending list (604), the process ends at (610). If node X is on the pending list (604), it is removed from the pending list (606). Node X is then linked (608) and placed in a linked list. The process ends at (610).

Figure 7:
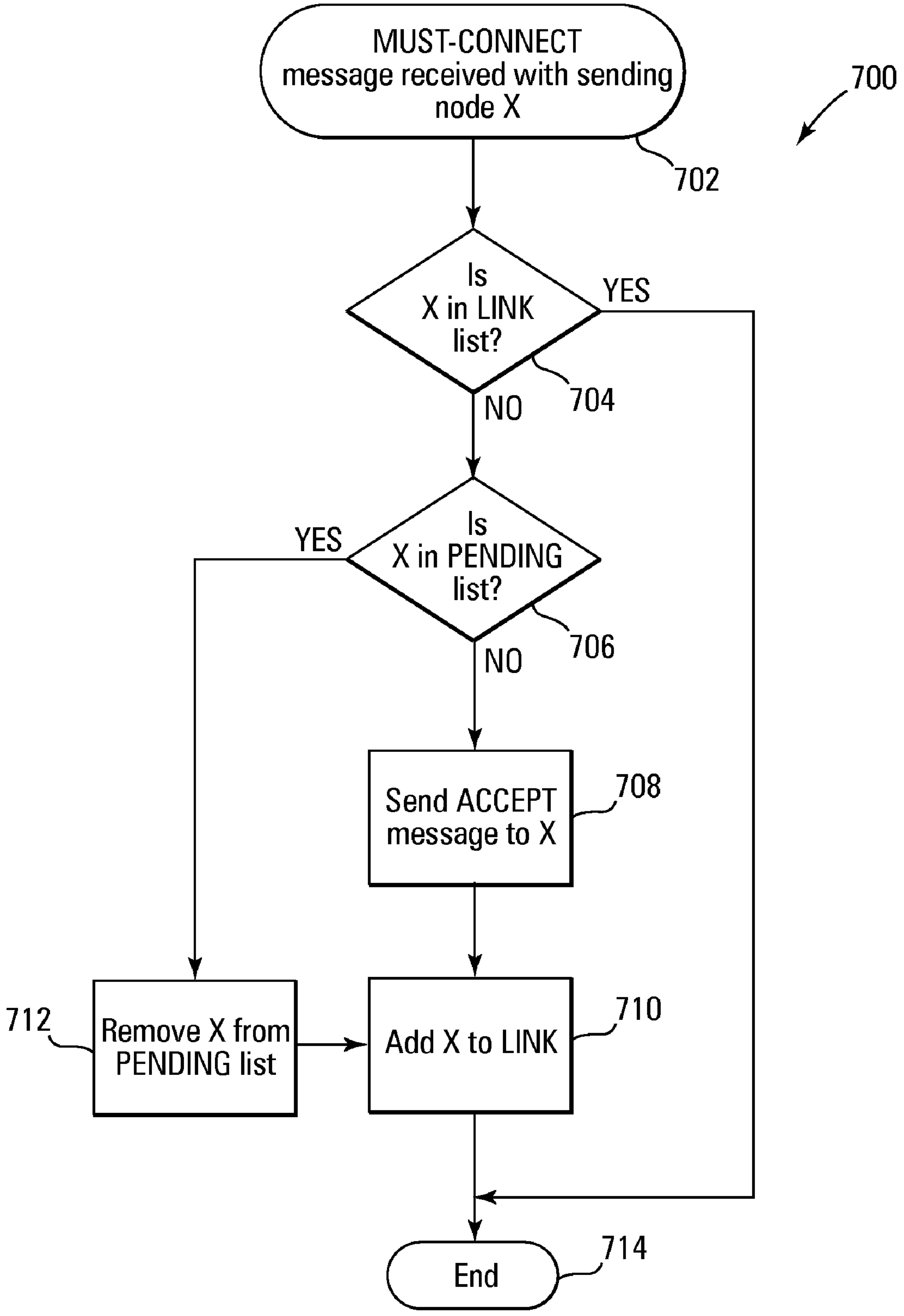
FIG. 7 is an illustration of a must-connect received flow diagram of one embodiment of the present invention.

In FIG. 7 a must-connect received flow diagram 700 of one embodiment is illustrated. A must-connect message is received from sending node X at (702). It is determined if node X is in the current link list (704). If node X is currently in the link list (704), the process ends at (714). If node X is not currently on the link list (704), it is determined if node X is on the pending list (706). If node X is on the pending list (706), node X is removed from the pending list (712) and node X is linked and added to the link list (710). If node X is not one the pending list, an accept message is sent to node X (708). Node X is then link and added to the linked list (710). The process ends at (714).

Figure 8:
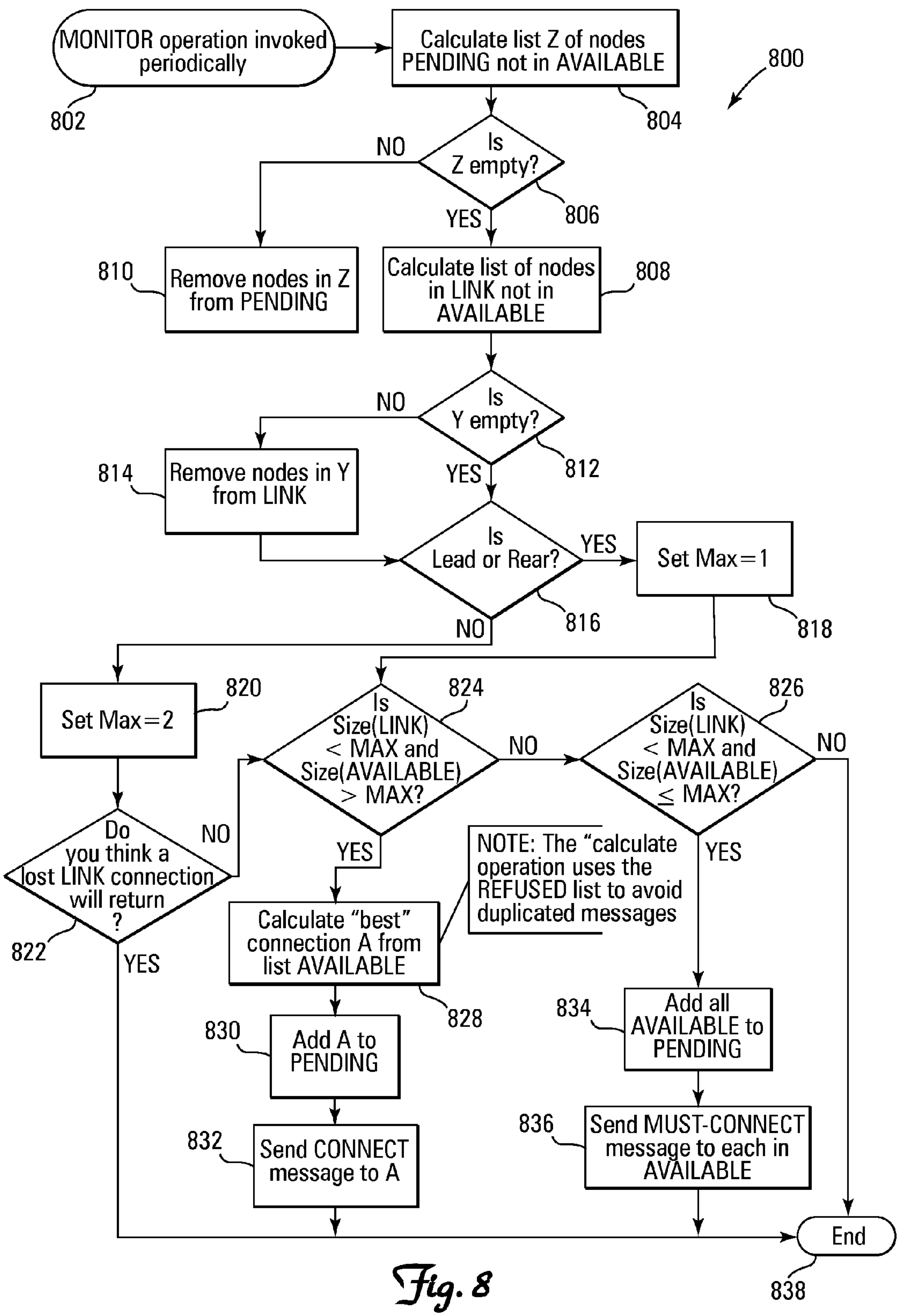
FIG. 8 is an illustration of a first monitor flow diagram of one embodiment of the present invention.

A first monitor flow diagram 800 of one embodiment is illustrated in FIG. 8. As illustrated, the monitor operation is invoked periodically (602). Once invoked, a list of Z nodes pending that are not available (604). It is determined if Z is empty (806). If Z is not empty (806), nodes in Z are removed from the pending list (810). As illustrated, once Z is empty (806), a list of Y nodes in a link list that are not available is calculated (808). It is then determined if Y is empty (812). If Y is not empty (812), nodes in Y are removed from the link list (814). Once Y is empty, it is determined if the node is a lead or rear node (816). If the node is a lead or rear node (816), its maximum number of allowable node connections is set to 1 (818). If the node is not a lead or rear (816), its maximum number of allowable node connections is set to 2 (820). It is then determined if it is likely a lost link connection will return (822). If it is likely the lost link will return (822), the process will end at (838). If it is not likely the link will return (822), it is determined if the size of the link is less than the maximum number of allowable connections and the size of the available list is greater than the maximum number of allowable connections (824). If the size of the link is less than the maximum and the size of the available list is greater than the maximum (824), the best connection node A is calculated from the available list (828). The best connection node A is added to the pending list (830) and a connect message is sent to node A (832). If the size of the link is not less than the maximum number of allowable connections or the size of the available list is not greater than the maximum number of allowable connections (824), it is determined whether the size of the link list is less than the maximum number of allowable connections and the size of the available list is less than or equal to the maximum number of allowable connections (826). If it is determined that the size of the link list is not less than the maximum or the size of the available list is not less than or equal to the maximum (826), the process ends at (838). If, however, it is determined that the size of the link list is less than the maximum and the size of the available list is less than or equal to the maximum (826), all available nodes are added to the pending list (834) and a must-connect message to each in the available list is sent (836). The process ends at (838).

Figure 9:
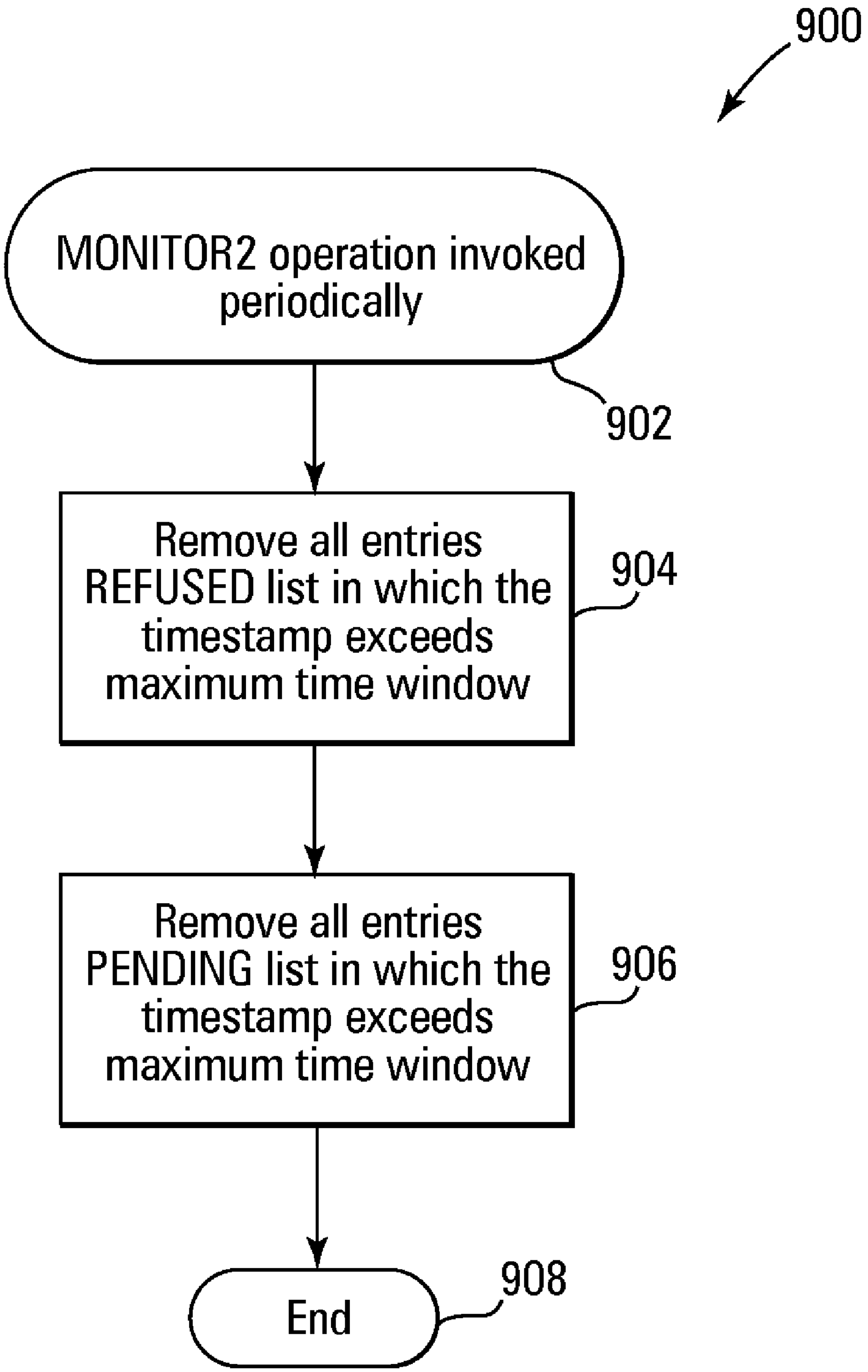
FIG. 9 is an illustration of a second monitor flow diagram of one embodiment of the present invention.

Referring to FIG. 9, a second monitor flow diagram (902) of one embodiment is illustrated. The monitor operation is invoked periodically (902). All entries in the refused list in which an associated timestamp exceeds a maximum time window are removed (904). All entries in the pending list in which the timestamp exceeds a maximum time window are removed (906). The process ends at (908).

The methods and techniques used by the controller of nodes as described above can be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of determining order of neighbor vehicles for each vehicle in a vehicle convoy communication network, the method comprising:

forming a vehicle convoy communication network including a lead vehicle, a rear vehicle, and one or more intermediate vehicles, wherein the lead vehicle, the rear vehicle, and the one or more intermediate vehicles are configured to intercommunicate, wherein connections between vehicles and neighboring vehicles are defined as link connections wherein the maximum number of link connections are as follows: one for the lead vehicle, one for the rear vehicle, and two for each of the intermediate vehicles;

for each vehicle in the convoy, determining a local sequence of neighbor vehicles in the vehicle convoy communication network based on order in past history of the vehicles in the convoy communication network; and upon receipt of a message from any vehicle in the vehicle convoy, modifying the local sequence to reflect the revised order of the communicatively linked neighbor vehicles.

2. The method of claim 1, further comprising:

updating the past history based on a change in local sequence.

3. The method of claim 1, wherein determining a local sequence further comprises:

determining other vehicles that can be communicated with in a single hop.

4. The method of claim 1, wherein modifying the local sequence further comprises:

using probabilities on historical data and on a change in received messages to determine a change in the local sequence.

5. The method of claim 1, wherein modifying the local sequence is further based at least in part on one of receiving messages from vehicles that are not established as nodes within the current convoy, on not receiving messages from vehicles in the current convoy, and on a time period since a message was last received from a vehicle in the convoy.

6. A non-transitory processor readable storage medium which stores processor executable instructions to perform the following:

forming a vehicle convoy communication network including a lead vehicle, a rear vehicle, and one or more intermediate vehicles, wherein the lead vehicle, the rear vehicle, and the one or more intermediate vehicles are configured to intercommunicate, wherein connections between vehicles and neighboring vehicles are defined as link connections wherein the maximum number of link connections are as follows: one for the lead vehicle, one for the rear vehicle, and two for each of the intermediate vehicles;

for each vehicle in the convoy, determining a local sequence of neighbor vehicles in the vehicle convoy communication network based on order in past history of the vehicles in the convoy communication network; and upon receipt of a message from any vehicle in the vehicle convoy, modifying the local sequence to reflect the revised order of the communicatively linked neighbor vehicles.

7. A method of determining order of neighbor vehicles for each vehicle in a vehicle convoy communication network, the method comprising:

forming a vehicle convoy communication network;

for each vehicle in the convoy, determining a local sequence of neighbor vehicles in the vehicle convoy communication network based on order in past history of the vehicles in the convoy communication network;

upon receipt of a message from any vehicle in the vehicle convoy, modifying the local sequence to reflect the revised order of the communicatively linked neighbor vehicles into a best order, wherein the best order is determined based upon assignment of a fitness value based upon at least one of the following criteria: number of refused messages, history of radio strength, history of established connections, number of connection requests, or number of must connect requests; and revising the local sequence so that the neighboring vehicles are in order of greatest fitness value to least fitness value.

8. The method of claim 7, further comprising:

updating the past history based on a change in local sequence.

9. The method of claim 7, wherein determining a local sequence further comprises:

determining other vehicles that can be communicated with in a single hop.

10. The method of claim 7, wherein modifying the local sequence further comprises:

using probabilities on historical data and on a change in received messages to determine a change in the local sequence.

11. The method of claim 7, wherein modifying the local sequence is further based at least in part on one of receiving messages from vehicles that are not established as nodes within the current convoy, on not receiving messages from vehicles in the current convoy, and on a time period since a message was last received from a vehicle in the convoy.

12. A non-transitory processor readable storage medium which stores processor executable instructions to perform the following:

forming a vehicle convoy communication network;

for each vehicle in the convoy, determining a local sequence of neighbor vehicles in the vehicle convoy communication network based on order in past history of the vehicles in the convoy communication network;

upon receipt of a message from any vehicle in the vehicle convoy, modifying the local sequence to reflect the revised order of the communicatively linked neighbor vehicles into a best order, wherein the best order is determined based upon assignment of a fitness value based upon at least one of the following criteria: number of refused messages, history of radio strength, history of established connections, number of connection requests, or number of must connect requests; and revising the local sequence so that the neighboring vehicles are in order of greatest fitness value to least fitness value.

13. A system for determining order of neighbor vehicles for each vehicle in a vehicle convoy communication network, the system comprising:

a processor; and a non-transitory processor readable storage medium containing instructions which are executable by the processor and perform the following:

forming a vehicle convoy communication network including a lead vehicle, a rear vehicle, and one or more intermediate vehicles, wherein the lead vehicle, the rear vehicle, and the one or more intermediate vehicles are configured to intercommunicate, wherein connections between vehicles and neighboring vehicles are defined as link connections, wherein the maximum number of link connections are as follows: one for the lead vehicle, one for the rear vehicle, and two for each of the intermediate vehicles;

for each vehicle in the convoy, determining a local sequence of neighbor vehicles in the vehicle convoy communication network based on order in past history of the vehicles in the convoy communication network; and upon receipt of a message from any vehicle in the vehicle convoy, modifying the local sequence to reflect the revised order of the communicatively linked neighbor vehicles.

* * * * *